(12) United States Patent
Jin

(10) Patent No.: US 12,124,718 B2
(45) Date of Patent: Oct. 22, 2024

(54) MEMORY SYSTEM AND OPERATING METHOD OF MEMORY SYSTEM

(71) Applicant: SK hynix Inc., Gyeonggi-do (KR)

(72) Inventor: Heung Tae Jin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 303 days.

(21) Appl. No.: 17/470,531

(22) Filed: Sep. 9, 2021

(65) Prior Publication Data

US 2022/0334745 A1 Oct. 20, 2022

(30) Foreign Application Priority Data

Apr. 19, 2021 (KR) .......... 10-2021-0050345

(51) Int. Cl.
*G06F 3/06* (2006.01)
(52) U.S. Cl.
CPC .......... *G06F 3/0635* (2013.01); *G06F 3/0619* (2013.01); *G06F 3/0659* (2013.01); *G06F 3/0673* (2013.01)
(58) Field of Classification Search
CPC .... G06F 3/0635; G06F 3/0619; G06F 3/0659; G06F 3/0673; G06F 12/00; G06F 13/00
See application file for complete search history.

(56) References Cited

U.S. PATENT DOCUMENTS

| | | | | |
|---|---|---|---|---|
| 2011/0145536 A1* | 6/2011 | Zachmann | .......... | G06F 11/0751 711/170 |
| 2016/0343444 A1* | 11/2016 | Park | .................. | G11C 16/3477 |
| 2018/0286485 A1* | 10/2018 | Takizawa | .......... | G11C 16/0483 |
| 2021/0342221 A1* | 11/2021 | Vlasov | ................. | G11C 29/021 |

FOREIGN PATENT DOCUMENTS

| | | |
|---|---|---|
| KR | 1020090123511 A | 12/2009 |
| KR | 1020150020430 A | 2/2015 |

* cited by examiner

*Primary Examiner* — Tuan V Thai
(74) *Attorney, Agent, or Firm* — IP & T GROUP LLP

(57) ABSTRACT

Embodiments of the present disclosure relate to a memory system and an operating method of the memory system. According to embodiments of the present disclosure, a memory system may store, for each of the plurality of memory dies, a program fail count indicating a cumulative number of occurrences of a program fail during a program operation for each memory die, and may change, for a target memory die among the plurality of memory dies, a first operation parameter among operation parameters applied to the target memory die when executing a program operation on the target memory die, based on a target program fail count which is the program fail count for the target memory die.

10 Claims, 12 Drawing Sheets

MEMORY SYSTEM AND OPERATING METHOD OF MEMORY SYSTEM

CROSS-REFERENCE TO RELATED APPLICATION

The present application claims priority under 35 U.S.C. 119(a) to Korean patent application number 10-2021-0050345 filed on Apr. 19, 2021, which is incorporated herein by reference in its entirety.

TECHNICAL FIELD

Various embodiments of the present disclosure relate to a memory system and an operating method of the memory system.

BACKGROUND

A memory system includes a data storage device that stores data on the basis of a request from a host, such as a computer, servers, a smartphone, a tablet PC, or other electronic devices. Examples of a memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling the memory device. The memory controller may receive a command from a host and, and, on the basis of the received command, may execute the command or control read/write/erase operations on the memory devices in the memory system. The memory controller may be used to execute firmware operations for performing a logical operation for controlling such operations.

When the memory system writes data in the memory device, the probability of an occurrence of a failure may vary depending on which memory die the data is written to among a plurality of memory dies included in the memory device.

SUMMARY

Embodiments of the present disclosure provide a memory system and an operating method of the memory system capable of preventing deterioration of program performance and shortage of lifespan due to the increase in the number of program fail occurrences in a specific memory die.

In addition, embodiments of the present disclosure provide a memory system and an operating method of the memory system capable of minimizing side effects caused by an increase in the time required for program operation.

In one aspect, embodiments of the present disclosure may provide a memory system including a memory device including a plurality of memory dies, and a memory controller communicating with the memory device and controlling the memory device.

The memory controller may store, for each of the plurality of memory dies, a program fail count indicating a cumulative number of occurrences of a program fail during a program operation for each memory die.

The memory controller may change, for a target memory die among the plurality of memory dies, a first operation parameter among operation parameters applied to the target memory die when executing a program operation on the target memory die, based on a target program fail count which is the program fail count for the target memory die.

In this case, the first operation parameter may be a time during which a plurality of bit lines included in the target memory die are precharged when executing the program operation on the target memory die.

In another aspect, embodiments of the present disclosure may provide an operating method of a memory system including a memory device including a plurality of memory dies and a memory controller communicating with the memory device and controlling the memory device.

The operating method of a memory system may include storing, for each of the plurality of memory dies, a program fail count indicating a cumulative number of occurrences of a program fail during a program operation for each memory die.

The operating method of a memory system may include changing, based on a target program fail count which is the program fail count for a target memory die among the plurality of memory dies, a first operation parameter among operation parameters applied to the target memory die when executing a program operation on the target memory die.

In this case, the first operation parameter may be a time during which a plurality of bit lines included in the target memory die are precharged when the program operation on the target memory die is executed.

In another aspect, embodiments of the present disclosure may provide a memory system including a memory device including a plurality of memory dies; and a controller coupled to the memory device.

The controller may determine a program fail count for a target memory die among the plurality of memory dies.

The controller may determine whether the program fail count is greater than or equal to a set threshold count.

When it is determined that the program fail count is greater than or equal to a set threshold count, the controller may adjust a set operation parameter for the target memory die.

The controller may control a plurality of bit lines of the target memory die to perform a program operation on the target memory die based on the adjusted operation parameter.

The operation parameter may include a time for precharging the plurality of bit lines.

The controller may maintain the set operation parameter for the target memory die when it is determined that the program fall count is less than the threshold count and control the plurality of bit lines of the target memory die to perform the program operation on the target memory die based on the set operation parameter.

The threshold count may be determined based on a change of the program fail count between two adjacent time periods.

According to embodiments of the present disclosure, it is possible to prevent issues in which program performance is deteriorated and lifespan is shortened due to the increase in the number of program fail occurrences in a specific memory die, and to minimize side effects caused by an increase in the time required for program operation.

DETAILED DESCRIPTION

Figure 1:
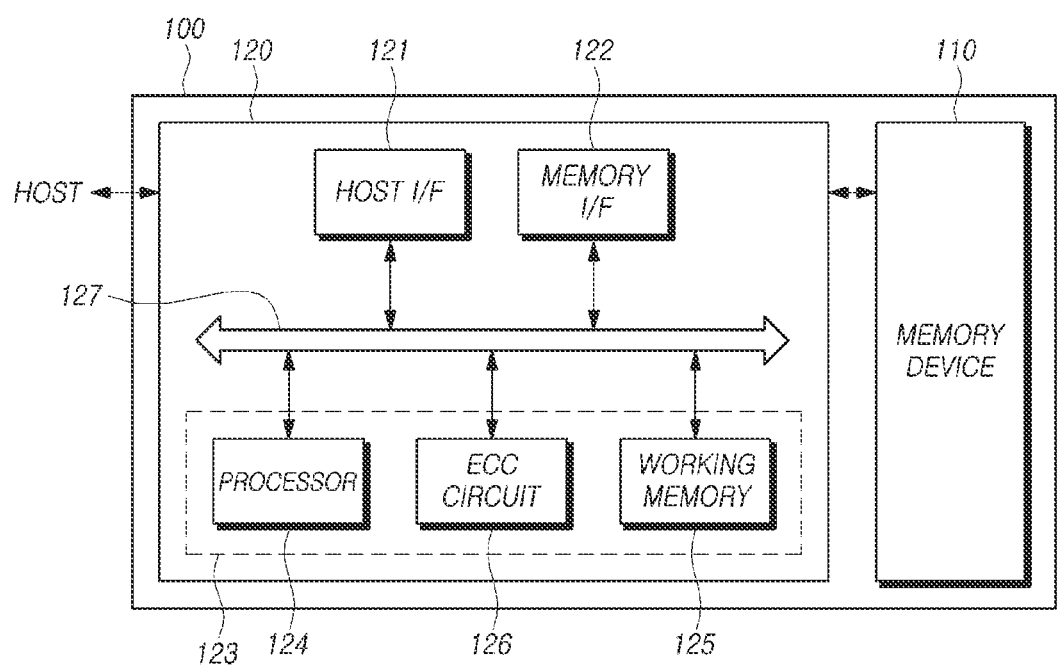
FIG. 1 is a schematic diagram illustrating a configuration of a memory system based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erase operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device 110 having a physical address corresponding to the received address from the memory controller 120.

In some implementations, the memory device 110 may perform a program operation, a read operation, an erase operation, and the like. During the program operation, the memory device 110 may write data in the area selected by the address. During the read operation, the memory device 110 may read data from a memory area selected by the address. During the erase operation, the memory device 110 may erase data stored in a memory area selected by the address.

The memory controller 120 may control write (program), read, erase, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device 110.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a host interface (I/F) 121, a memory interface 122, and a control circuit 123.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host and to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In the present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, when the BER is greater than a reference value, the error detection/correction circuit 126 may determine that the erroneous bits in the corresponding sector are uncorrectable and the corresponding sector is marked "fail." When the BER is less than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those elements illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
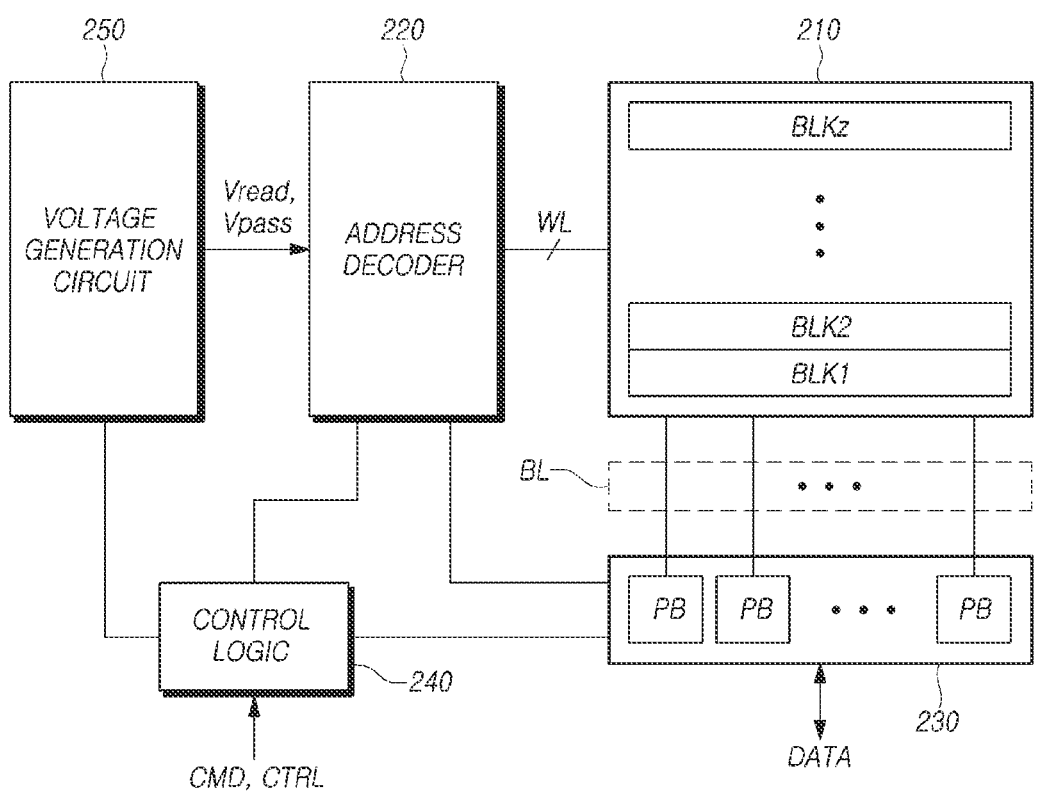
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 may include a memory cell array 210, an address decoder 220, a read/write circuit 230, a control logic 240, and a voltage generation circuit 250.

The memory cell array 210 may include multiple memory blocks BLK1-BLKz, where z is a natural number greater than or equal to 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erase operation may be performed memory block by memory block.

Figure 3:
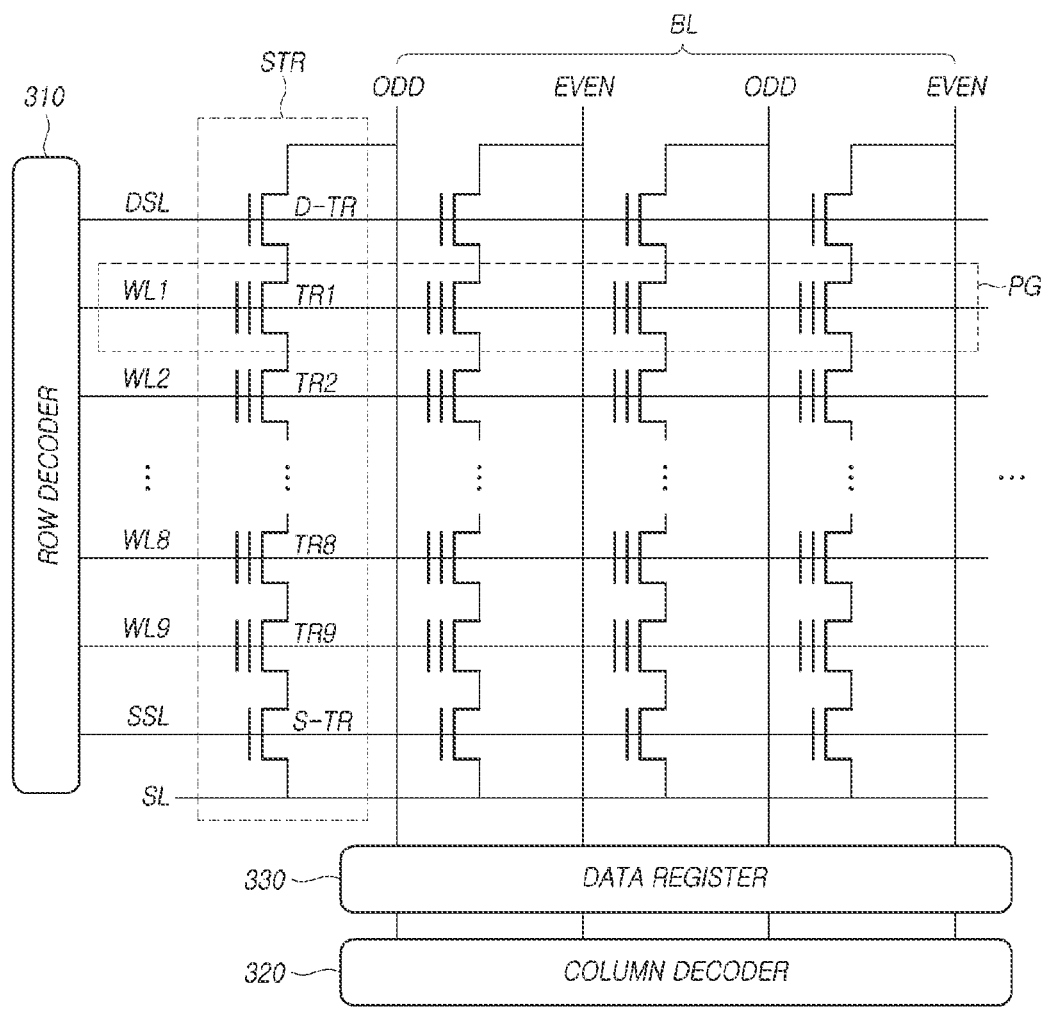
FIG. 3 illustrates a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of an odd-numbered bit line and an even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

In the illustrated example of FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erase operation. The memory system 100 applies a certain voltage to allow both the first selection transistor D-TR and the second selection transistor S-TR to float during an erase operation. As a result, the applied erase voltage can remove electrical charges from the floating gates FG of the selected memory cells.

Figure 4:
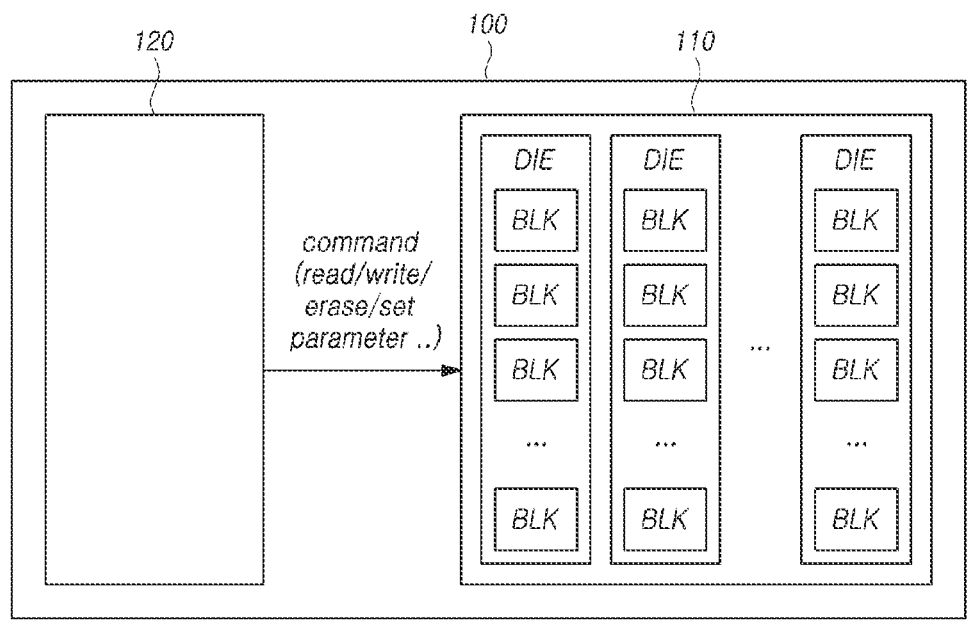
FIG. 4 illustrates a schematic structure of a memory system according to embodiments of the present disclosure.

FIG. 4 illustrates a schematic structure of a memory system 100 according to embodiments of the present disclosure.

Referring to FIG. 4, the memory system 100 may include a memory device 110 and a memory controller 120.

The memory device 110 may include a plurality of memory dies DIE. In addition, each of the plurality of memory dies DIE may include a plurality of memory blocks BLK. Each of the plurality of memory dies DIE may include a plurality of memory cells, a plurality of word lines, and a plurality of bit lines, as described with reference to FIG. 2.

The memory controller 120 may communicate with the memory device 110 and control the memory device 110. The memory controller 120 may input a command to the memory device 110 to control the memory device 110. For example, the memory controller 120 may input a command instructing the memory device 110 to execute a read, write, or erase operation to the memory device 110.

As another example, the memory controller 120 may input a command for setting one of a plurality of operation parameters applied to the memory device 110 to the memory device 110. The plurality of operation parameters applied to the memory device 110 are parameters for controlling operations (e.g., read/write/erase operations) for the plurality of memory dies DIE included in the memory device 110. For example, the plurality of operation parameters may be time values required to execute a part of the operations on the plurality of memory dies DIE.

Physical characteristics of each of the plurality of memory dies DIE may be different from each other due to variations in mass production/processing. For example, specific memory dies among the plurality of memory dies DIE may include more corner materials (e.g., NMOS Slow) than other memory dies, which have a smaller power-related margin value than other materials.

Accordingly, when the same operation parameters are applied to all of the plurality of memory dies DIE, a memory die having weak physical characteristics among the plurality of memory dies DIE is more likely to fail during operation than other memory dies. In this case, performance of the memory system 100 may deteriorate due to a failure occurring in a memory die having a weak physical characteristic.

Therefore, the memory system 100 may change all or a part of operation parameters applied to a memory die having weak physical characteristics among the plurality of memory dies DIE to be different from all or a part of the operation parameters applied to the other memory die.

Hereinafter, in embodiments of the present disclosure, an operation in which the memory controller 120 of the memory system 100 changes an operation parameter applied to one memory die among the plurality of memory dies DIE included in the memory device 110, will be described.

Figure 5:
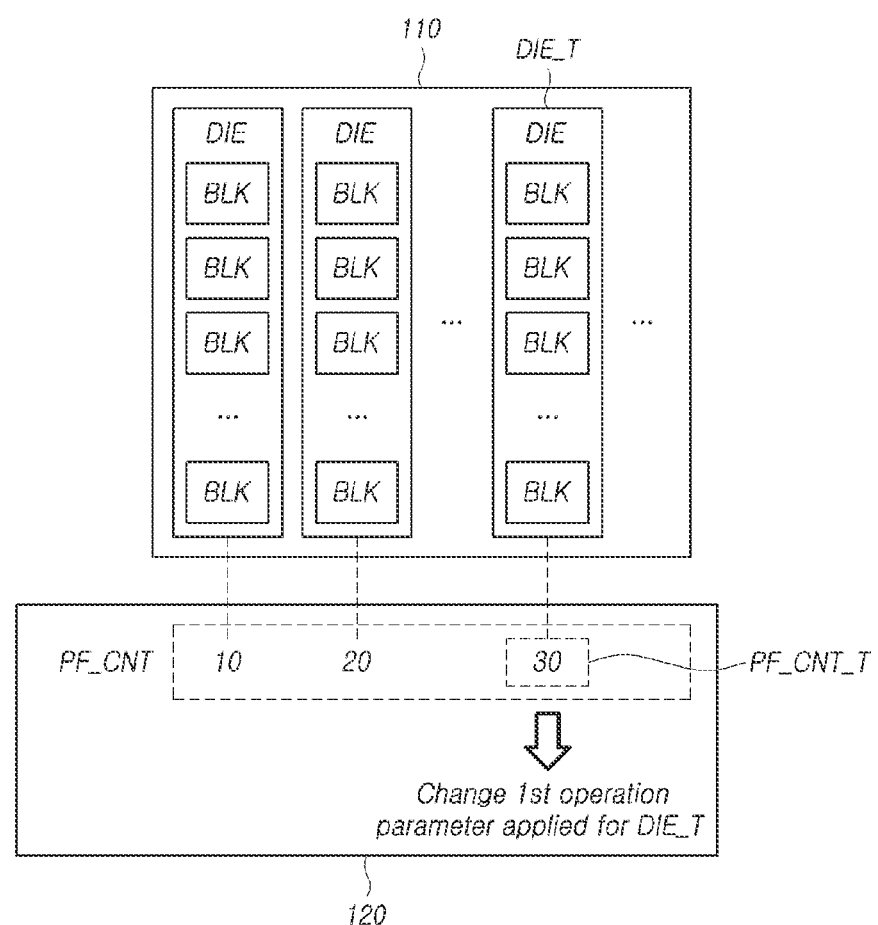
FIG. 5 illustrates an operation of changing an operation parameter applied to a target memory die by a memory system according to embodiments of the present disclosure.

FIG. 5 illustrates an operation of changing an operation parameter applied to a target memory die DIE_T by a memory system 100 according to embodiments of the present disclosure.

Referring to FIG. 5, a memory controller 120 of the memory system 100 may change, for a target memory die DIE_T among the plurality of memory dies DIE, a first operation parameter among operation parameters applied to the target memory die DIE_T when executing a program operation on the target memory die DIE_T.

In embodiments of the present disclosure, the memory controller 120 may store, for each of the plurality of memory dies DIE, a program fail count PF_CNT which is a count value indicating a cumulative number of occurrences of a program fail during a program operation for each memory die. The memory controller 120 may monitor that a program fail occurs during a program operation for each memory die for each of the plurality of memory dies DIE, and store the program fail count PF_CNT for each memory die. For example, the memory controller 120 may store the program fail count PF_CNT for each memory die in the memory controller 120 (e.g., the working memory 125) or in the memory device 110.

For a target memory die DIE_T which is one of the plurality of memory dies DIE, the memory controller 120 may change a first operation parameter which is an operation parameter applied to the target memory die DIE_T based on a target program fail count PF_CNT_T which is the program fail count PF_CNT for the target memory die DIE_T.

Here, the occurrence of a program fail during a program operation on the target memory die DIE_T means that, as a result of verifying data programmed in the target memory die DIE_T by the memory device 110, the corresponding data has been not normally programmed into the target memory die DIE_T and an error has occurred. When the memory controller 120 transmits a command requesting data programming to the memory device 110, the memory device 110 may respond to the memory controller 120 with a message indicating that a failure has occurred in the process of programming the corresponding data. In addition, the memory controller 120 may verify that data is not normally programmed into the target memory die DIE_T based on the response of the memory device 110.

Due to the difference in the physical characteristics of each of the plurality of memory dies DIE described above in FIG. 4, the frequency at which a program fail occurs during a program operation may be different for each of the plurality of memory dies DIE.

The memory controller 120 may determine whether a first operation parameter is suitable for physical characteristics of the target memory die DIE_T based on the target program fail count PF_CNT_T. Here, the target program fail count PF_CNT_T is the program fail count PF_CNT for the target memory die DIE_T among the plurality of memory dies DIE, and the first operation parameter is an operation parameter currently applied to the target memory die DIE_T. When it is determined that the frequency of program fail occurrences in the target memory die DIE_T is high because the first operation parameter is not suitable for the physical characteristics of the target memory die DIE_T, the memory controller 120 may change the first operation parameter in order to reduce the frequency of program fail occurrences in the target memory die DIE_T.

As described above, the memory controller 120 may set an operation parameter suitable for a specific memory die having weak physical characteristics among the plurality of memory dies DIE, so that it is possible to prevent degradation of program performance due to an increase in the frequency of program fail occurring in a specific memory die.

In addition, the memory controller 120 may prevent an additional program operation on the corresponding memory die from being executed due to an increase in the frequency of a program fail occurring in a specific memory die among the plurality of memory dies DIE. Accordingly, it is possible to prevent the number of free memory blocks included in the corresponding memory die from being reduced and the overall lifespan of the memory system 100 from being reduced.

In FIG. 5, the values of the program fail count PF_CNT for each of the plurality of memory dies DIE are 10, 20, . . . , 30. In this case, the memory controller 120 may change the first operation parameter applied to the target memory die DIE_T based on a value of 30 of the target program fail count PF_CNT_T that is the program fail count PF_CNT for the target memory die DIE_T.

In some embodiments, the program fail count PF_CNT for the target memory die DIE_T may be the number of program fail occurring after a set reference time (e.g., the time when the memory system 100 is powered on/the time of manufacturing the memory system 100) or during a set time period (e.g., 30 minutes).

Hereinafter, an example of an operation in which the memory system 100 changes the above-described first operation parameter will be described. First, an example of an operation in which the memory system 100 determines whether to change the first operation parameter will be described.

Figure 6:
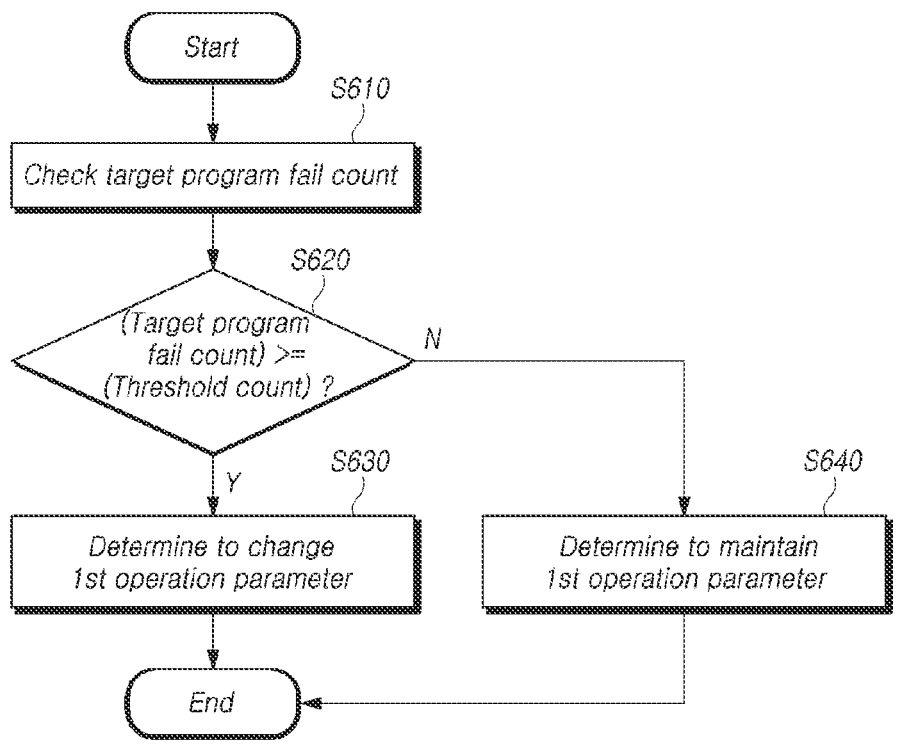
FIG. 6 is a flowchart illustrating an example of an operation of determining whether to change a first operation parameter by a memory system according to embodiments of the present disclosure.

FIG. 6 is a flowchart illustrating an example of an operation of determining whether to change a first operation parameter by a memory system 100 according to embodiments of the present disclosure.

Referring to FIG. 6, the memory controller 120 of the memory system 100 may check the target program fail count, which is the program fail count for the target memory die DIE_T described with reference to FIG. 5 (S610). As described in FIG. 5, the memory controller 120 may internally manage the program fail count for each of the plurality of memory dies DIE. Further, the memory controller 120 may, among the program fail counts for the plurality of memory dies DIE, check the target program fail count which is the program fail count for the target memory die DIE_T.

The memory controller 120 may determine whether the target program fail count checked in operation S610 is greater than or equal to a set threshold count (S620).

When it is determined that the target program fail count is greater than or equal to the set threshold count (S620-Y), the memory controller 120 may determine to change the first operation parameter applied to the target memory die DIE_T (S630). On the other hand, when it is determined that the target program fail count is less than the set threshold count (S620-N), the memory controller 120 may determine to maintain the first operation parameter applied to the target memory die DIE_T (S640).

The feature that the program fail count for the target memory die DIE_T is greater than or equal to the threshold count may mean that there is a high probability of a program fail occurring during a program operation to the target memory die DIE_T. Accordingly, the memory controller 120 may change the first operation parameter applied when executing the program operation on the target memory die DIE_T in order to reduce the possibility of a program fail occurrence during the program operation on the target memory die DIE.

In some embodiments, the threshold count serving as a criterion for determining whether to change the first operation parameter may be a fixed value or a value which is changed according to the state (e.g., revision information, process information) of the target memory die DIE_T. Hereinafter, an example in which the memory system 100 changes the threshold count will be described.

Figure 7:
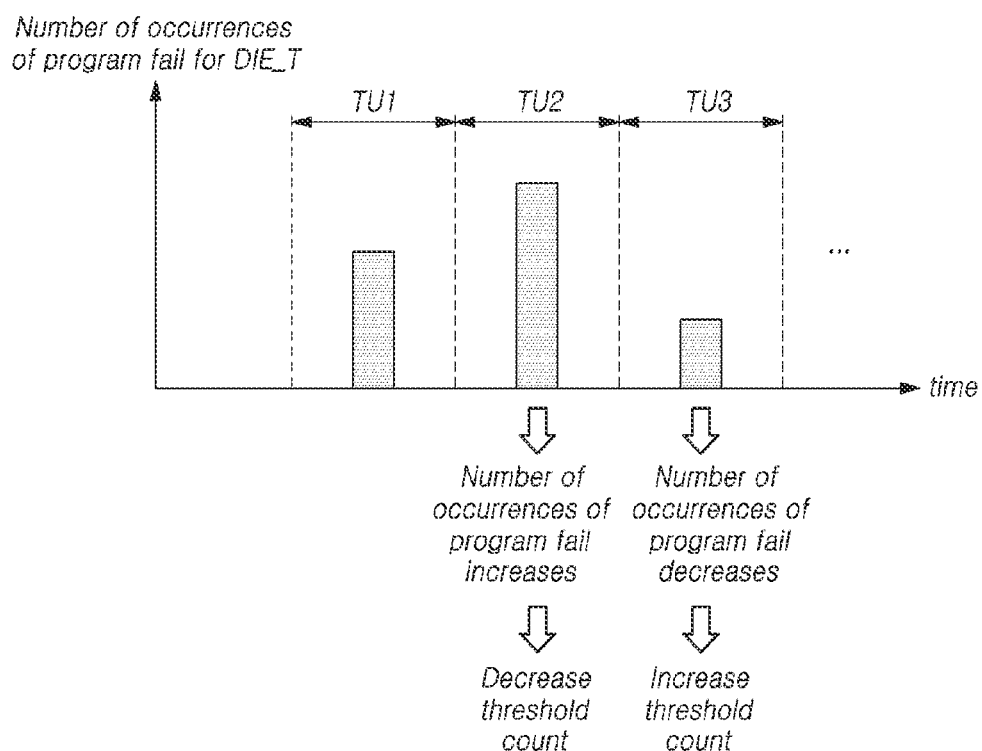
FIG. 7 illustrates an example of changing the threshold count described with reference to FIG. 6 by the memory system according to embodiments of the present disclosure.

FIG. 7 illustrates an example of changing the threshold count described with reference to FIG. 6 by the memory system 100 according to embodiments of the present disclosure.

The memory controller 120 of memory system 100 may change the threshold count differently depending on whether the number of occurrences of the program fail in the target memory die DIE_T during a set target unit time increases or decreases than the number of occurrences of the program fail in the target memory die DIE_T during a unit time before the target unit time.

In FIG. 7, the memory controller 120 may check the number of times a program fail occurs in the target memory die DIE_T per unit time.

For example, in a case where the target unit time is set as the unit time TU2, when the number of occurrences of the program fail in the target memory die DIE_T during the unit time TU2 is increased to be greater than the number of occurrences of the program fail in the target memory die DIE_T during the unit time TU1 which is the unit time before the unit time TU2, the memory controller 120 may decrease the value of the threshold count.

The fact that the number of occurrences of the program fail in the target memory die DIE_T during the target unit time is increased to be greater than the number of occurrences of the program fail in the target memory die DIE_T during the unit time before the target unit time may mean that the frequency of occurrence of program fail in the target memory die DIE_T increases.

Accordingly, there may be a higher probability of a program fail occurring for the target memory die DIE_T in the future. Accordingly, the memory controller 120 may decrease the threshold count to advance the timing at which the first operation parameter may be changed, thereby reducing the possibility of a subsequent program fail.

On the other hand, in a case where the target unit time is set as the unit time TU3, when the number of occurrences of the program fail in the target memory die DIE_T during the unit time TU3 is decreased to be less than the number of occurrences of the program fail in the target memory die DIE_T during the unit time TU2 which is the unit time before the unit time TU3, the memory controller 120 may increase the value of the threshold count.

The fact that the number of occurrences of the program fail in the target memory die DIE_T during the target unit time is decreased to be less than the number of occurrences of the program fail in the target memory die DIE_T during the unit time before the target unit time may mean that the frequency of occurrence of program fail in the target memory die DIE_T decreases.

Therefore, there may be a lower probability of a program fail occurring for the target memory die DIE_T in the future. Accordingly, the memory controller 120 may increase the threshold count to delay the timing at which the first operation parameter may be changed, thereby maintaining the first operation parameter for a longer period in a state with a low probability of a program fail.

In the above a condition for the memory system 100 to change the first operation parameter, has been described. Hereinafter, a specific method of changing the first operation parameter by the memory system 100, will be described.

Figure 8:
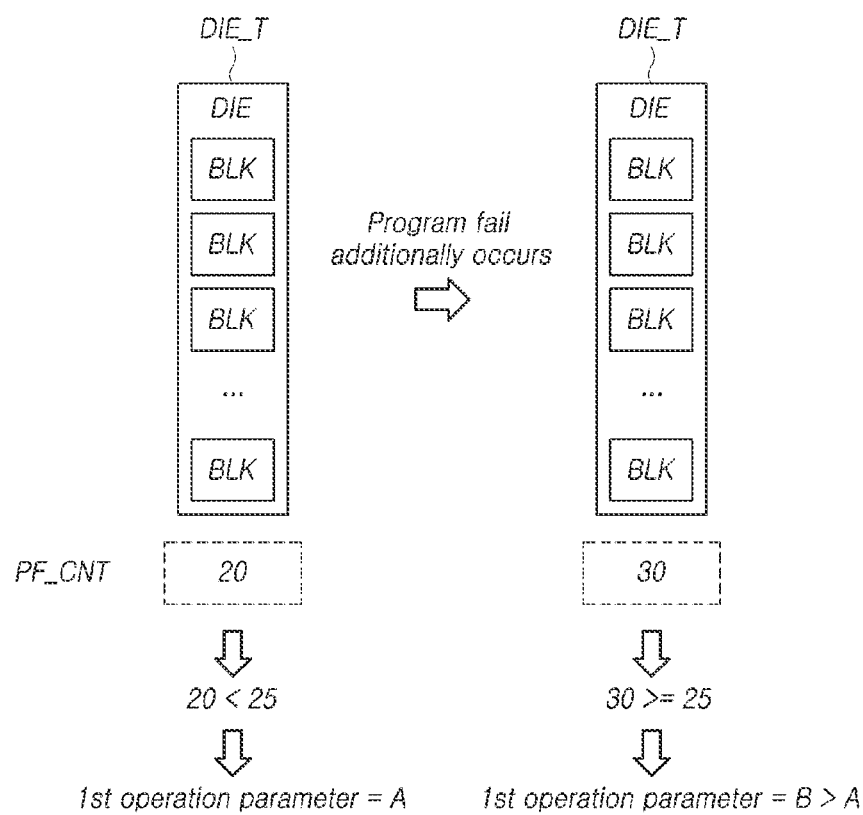
FIG. 8 is a diagram for describing an example of an operation of changing a first operation parameter by a memory system according to embodiments of the present disclosure.

FIG. 8 is a diagram for describing an example of an operation of changing a first operation parameter by a memory system 100 according to embodiments of the present disclosure.

Referring to FIG. 8, when changing the first operation parameter, the memory controller 120 of the memory system 100 may increase the value of the first operation parameter.

In FIG. 8, in the case that the threshold count THR is 25 and the program fail count PF_CNT for the target memory die DIE_T is 20 less than 25, the first operation parameter is A.

Here, a program fail additionally occurs during a program operation on the target memory die DIE_T, so that the program fail count PF_CNT for the target memory die DIE_T becomes 30, which is greater than 25. In this case, the memory controller 120 may set the first operation parameter to B greater than A.

As described above, a reason for increasing the value of the first operation parameter when the memory controller 120 changes the value of the first operation parameter, is because when the value of the first operation parameter is less than a value required to normally perform a program operation on the target memory die DIE_T, there is a high possibility of program fail.

When the value of the first operation parameter increases, the time required for the program operation for the target memory die DIE_T increases. Accordingly, the memory controller 120 may increase the value of the first operation parameter only when it is necessary to reduce the probability of the occurrence of a program fail, thereby minimizing the side effect caused by the increase of time required for the program operation for the target memory die DIE_T.

Hereinafter, a specific example of the first operation parameter will be described.

Figure 9:
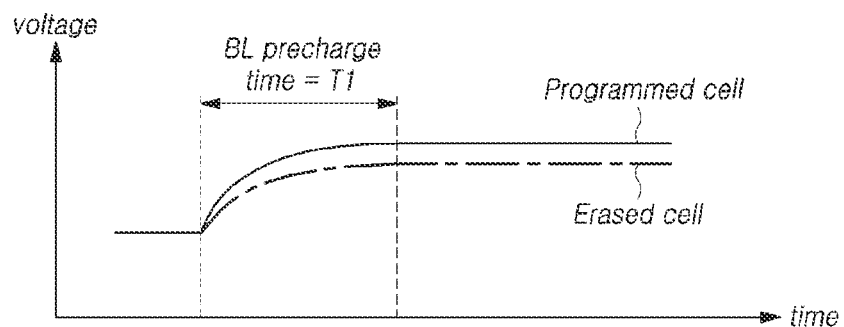
FIG. 9 is a diagram for describing an example of a first operation parameter according to embodiments of the present disclosure.
Figure 9:
Figure 9:
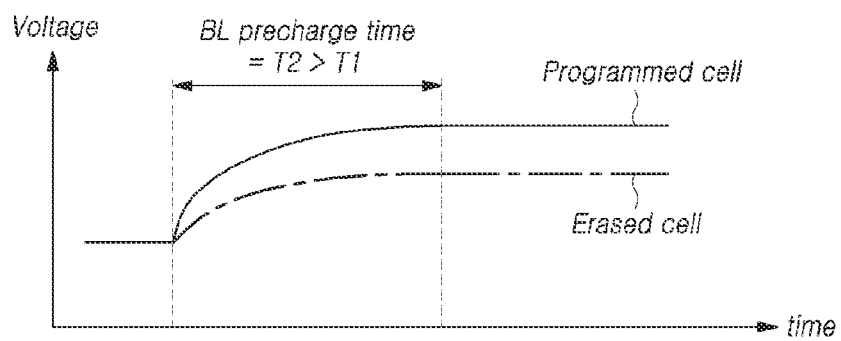

FIG. 9 is a diagram for describing an example of a first operation parameter according to embodiments of the present disclosure.

The first operation parameter may be a time during which a plurality of bit lines included in the target memory die DIE_T are precharged when executing a program operation on the target memory die DIE_T.

When a program operation on the target memory die DIE_T is executed, the memory device 110 may repeatedly execute program pulse steps in order to program a plurality of memory cells to be programmed (in this case, the plurality of memory cells are in an erase state) to a target program state. In this case, the number of program states for the plurality of memory cells may vary according to the types of the memory cells. For example, in the case that the plurality of memory cells are TLCs, each memory cell may be in an erase state or may have one program state of seven program states.

The memory device 110 may program data in the plurality of memory cells while increasing the size of the program pulse applied to the word line connected to the plurality of memory cells by the set step pulse value whenever the program pulse step is repeated.

In this case, in the process of programming the plurality of memory cells, the memory device 110 may inhibit an operation of applying a program pulse to a word line connected to a memory cell which has reached a target program state among the plurality of memory cells. As a result of repeating this process, the memory device 110 may normally terminate the program operation when all of the plurality of memory cells to be programmed reach the target program state.

In some embodiments, the memory device 110 may perform a verification operation on the corresponding memory cell in order to determine whether any of the plurality of memory cells has reached the target program state at each program pulse step. In order to perform the verification operation on the corresponding memory cell, the memory device 110 may precharge a plurality of bit lines included in the target memory die DIE_T.

In this case, when the voltage of the bit line does not reach the target value due to insufficient time for precharging the plurality of bit lines, the sensing voltage level of the corresponding memory cell may be lowered during the verification operation of the corresponding memory cell. In this case, even though the corresponding memory cell has actually reached the target program state, the memory device 110 may erroneously determine the program state of the corresponding memory cell during the verification operation, and thus the verification operation for the corresponding memory cell may fail.

In this case, the memory device 110 additionally executes an operation applied to the corresponding memory cell. In addition, when the number of times of executing the program pulse operation for the corresponding memory cell exceeds the set maximum value, the memory device 110 may determine that a program fail has occurred even though the corresponding memory cell actually reaches the target program state.

Accordingly, the memory controller 120 may increase the time for precharging the plurality of bit lines included in the target memory die DIE_T so that the voltage of the bit lines reaches the target value, thereby preventing a verification failure from occurring in the verification process of the memory cell that has actually reached the target program state.

In FIG. 9, the memory controller 120 may increase the precharge time for the plurality of bit lines in the target memory die DIE_T from T1 to T2. In this case, the memory controller 120 may transmit a command instructing the target memory die DIE_T to increase the precharge time of the plurality of bit lines from T1 to T2 to the memory device 110.

In some embodiments, the memory device 110 may increase the time during which the plurality of bit lines are precharged only in some program pulse operations, instead of increasing the time for precharging the plurality of bit lines in all program pulse operations during the program operation. As an example, the memory device 110 may increase the time during which the plurality of bit lines are precharged when the program pulse operation is executed more than a set threshold number of times. As another example, the memory device 110 may increase the time during which the plurality of bit lines are precharged only in the last executable program pulse operation.

In some embodiments, the memory controller 120 of the memory system 100 may additionally change a second operation parameter in addition to the above-described first operation parameter among operation parameters applied to the target memory die DIE_T.

Figure 10:
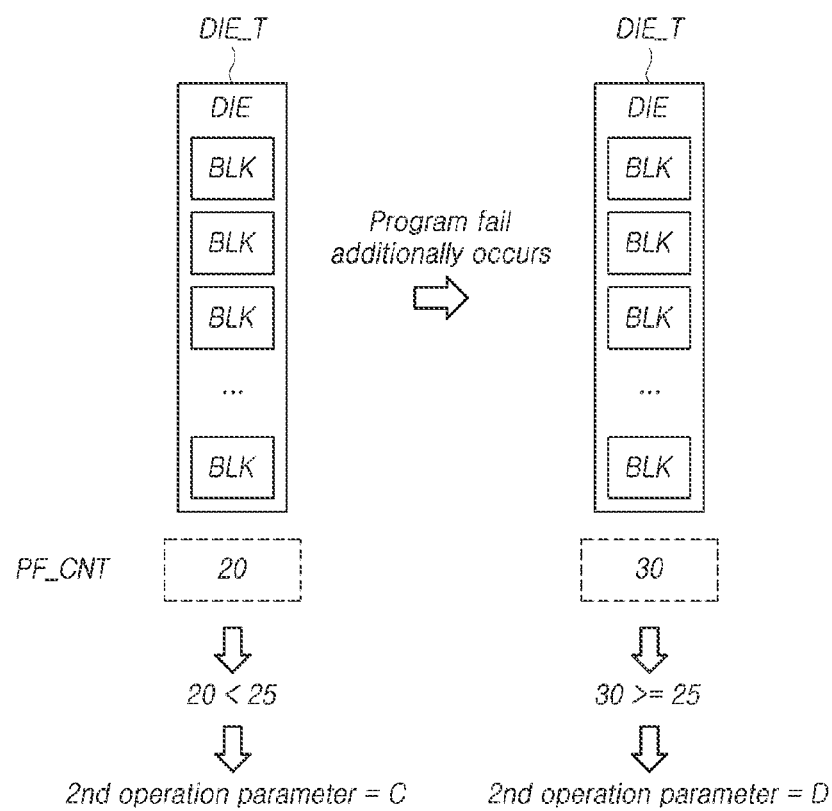
FIG. 10 is a diagram illustrating an example of a second operation parameter according to embodiments of the present disclosure.

FIG. 10 is a diagram illustrating an example of a second operation parameter according to embodiments of the present disclosure.

Referring to FIG. 10, similar to FIG. 8, the memory controller 120 of the memory system 100 may increase the value of the second operation parameter when changing the second operation parameter.

In FIG. 10, the second operation parameter is C when the threshold count THR is 25 and the program fail count PF_CNT for the target memory die DIE_T is 20 less than 25.

In addition, a program fail additionally occurs during a program operation on the target memory die DIE_T, so that the program fail count PF_CNT for the target memory die DIE_T becomes 30, which is greater than 25. In this case, the memory controller 120 may set the second operation parameter to D greater than C.

In FIG. 10, the second operation parameter may be a time when a channel corresponding to the target memory die DIE_T is initialized (channel initialize time), a time during which a plurality of bit lines or a plurality of word lines included in the target memory die DIE_T are discharged (BL discharge time or WL discharge time), or a time for equalizing voltages applied to a plurality of word lines included in the target memory die DIE_T (WL equalize time).

The channel initialization time may be the time at which the channel corresponding to the target memory die DIE_T is initialized and may be a time required to initialize a channel used for communication for transmitting and receiving, commands and responses between the target memory die DIE_T and the memory controller 120.

The time during which a plurality of bit lines included in the target memory die DIE_T are discharged may be a time required for discharging the precharged voltage to the plurality of bit lines during a program operation on the target memory die DIE_T.

The time during which a plurality of word lines included in the target memory die DIE_T are discharged may be a time required for discharging the precharged voltage to the plurality of word lines during a program operation on the target memory die DIE_T.

The time for equalizing voltages applied to a plurality of word lines included in the target memory die DIE_T may be a time required to equalize voltages applied to a plurality of word lines, which are in different voltage states by applying a program voltage only to a specific word line during a program operation process, to the same level.

Figure 11:
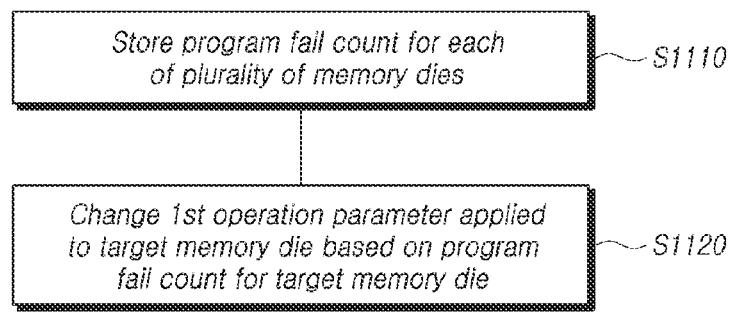
FIG. 11 illustrates an operating method of a memory system according to embodiments of the present disclosure.

FIG. 11 illustrates an operating method of a memory system 100 according to embodiments of the present disclosure.

Referring to FIG. 11, the operating method of the memory system 100 may include, for each of the plurality of memory dies DIE, storing a program fail count indicating the accumulated number of occurrences of a program fail during a program operation for each memory die (S1110).

In addition, the operating method of the memory system 100 may include changing, based on a target program fail count which is the program fail count for a target memory die DIE_T among the plurality of memory dies DIE, a first operation parameter among operation parameters applied to the target memory die DIE_T when executing a program operation on the target memory die DIE_T (S1120).

In operation S1120, for example, when the target program fail count is greater than or equal to a set threshold count, the first operation parameter may be changed.

The threshold count may be changed differently depending on whether the number of occurrences of the program fails in the target memory die DIE_T during a set target unit time is increased to be greater than the number of occurrences of the program fail in the target memory die DIE_T during a unit time before the target unit time.

The first operation parameter may increase when the first operation parameter is changed.

The first operation parameter may be, for example, a time during which a plurality of bit lines included in the target memory die DIE_T are precharged when executing the program operation on the target memory die DIE_T.

In addition, the operating method of the memory system 100 may further include changing a second operation parameter among operation parameters applied to the target memory die DIE_T.

The second operation parameter may be, for example, 1) a time at which a channel corresponding to the target memory die DIE_T is initialized, 2) a time during which a plurality of bit lines included in the target memory die DIE_T are discharged, 3) a time during which a plurality of word lines included in the target memory die DIE_T are discharged, or 4) a time for equalizing voltages applied to the plurality of word lines included in the target memory die DIE_T.

Figure 12:
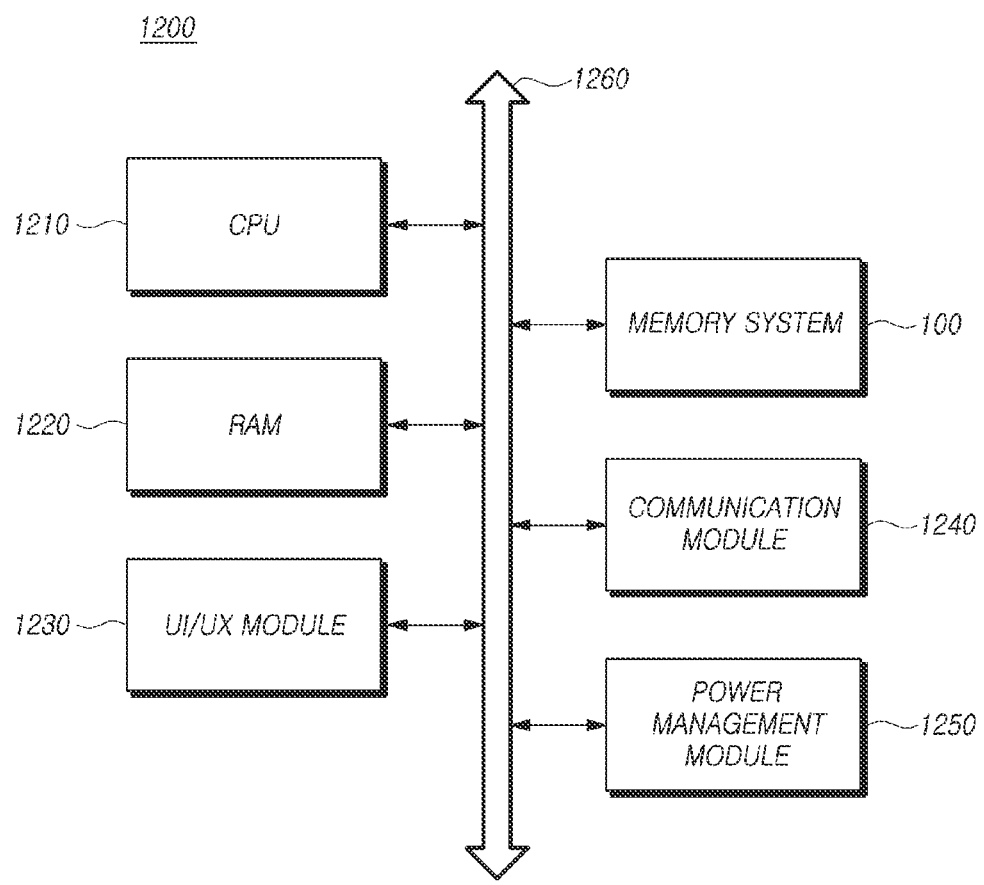
FIG. 12 is a diagram illustrating the configuration of a computing system based on some embodiments of the disclosed technology.

FIG. 12 is a diagram illustrating the configuration of a computing system 1200 based on an embodiment of the disclosed technology.

Referring to FIG. 12, the computing system 1200 may include: a memory system 100 electrically connected to a system bus 1260; a CPU 1210 configured to control the overall operation of the computing system 1200; a RAM 1220 configured to store data and information related to operations of the computing system 1200; a user interface/user experience (UI/UX) module 1230 configured to provide the user with a user environment; a communication module 1240 configured to communicate with an external device as a wired and/or wireless type; and a power management module 1250 configured to manage power used by the computing system 1200.

The computing system 1200 may be a personal computer (PC) or may include a mobile terminal such as a smartphone, a tablet or various electronic devices.

The computing system 1200 may further include a battery for supplying an operating voltage, and may further include an application chipset, a graphic-related module, a camera image processor, and a DRAM. Other elements would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims. Furthermore, the embodiments may be combined to form additional embodiments.

What is claimed is:

1. A memory system comprising:
    a memory device including a plurality of memory dies; and
    a memory controller controlling the memory device,
    wherein the memory controller is configured to:
        store, for each of the plurality of memory dies, a program fail count indicating a cumulative number of occurrences of a program fail during a program operation for each memory die, and
        change, for a memory die having program fail count greater than or equal to a set threshold count among the plurality of memory dies, a timing parameter related to determining a program state of the memory die, based on the program fail count for the memory die.

2. The memory system of claim 1, wherein the memory controller changes the threshold count differently depending on whether the program fail count for the memory die during a set unit time is increased to be greater than or is decreased to be less than the program fail count for the memory die during a unit time before the unit time.

3. The memory system of claim 1, wherein the memory controller increases the timing parameter when the program fail count for the memory die is greater than or equal to the threshold count.

4. The memory system of claim 3, wherein the timing parameter includes a time during which a plurality of bit lines included in the memory die are precharged when executing the program operation on the memory die.

5. The memory system of claim 3, wherein the memory controller further changes another timing parameter applied to the memory die, and
    wherein the another timing parameter further comprises at least one of a time at which a channel corresponding to the memory die is initialized, a time during which a plurality of bit lines included in the memory die are discharged, a time during which a plurality of word lines included in the memory die are discharged, or a time for equalizing voltages applied to the plurality of word lines included in the memory die.

6. An operating method of a memory system including a memory device including a plurality of memory dies, the operating method comprising:
    storing, for each of the plurality of memory dies, a program fail count indicating a cumulative number of occurrences of a program fail during a program operation for each memory die, and
    changing, based on a program fail count for a memory die having program fail count greater than or equal to a set threshold count among the plurality of memory dies, a timing parameter related to determining a program state of the memory die.

7. The operating method of claim 6, wherein the threshold count is changed differently depending on whether the program fail count for the memory die during a set unit time is increased to be greater than the program fail count for the memory die during a unit time before the unit time.

8. The operating method of claim 6, wherein the timing parameter is increased when the program fail count for the memory die is greater than or equal to the threshold count.

9. The operating method of claim 8, wherein the timing parameter includes a time during which a plurality of bit lines included in the memory die are precharged when the program operation on the memory die is executed.

10. The operating method of claim 8, further comprising changing another timing parameter applied to the memory die,
    wherein the another timing parameter further comprises at least one of a time at which a channel corresponding to the memory die is initialized, a time during which a plurality of bit lines included in the memory die are discharged, a time during which a plurality of word lines included in the memory die are discharged, or a time for equalizing voltages applied to the plurality of word lines included in the memory die.

* * * * *